May 26, 1964 K. LEHOVEC ETAL 3,134,159
METHOD FOR PRODUCING AN OUT-DIFFUSED GRADED-BASE TRANSISTOR
Filed March 26, 1959 2 Sheets-Sheet 1

INVENTORS
KURT LEHOVEC
RAINER ZULEEG
BY Connolly and Hutz
THEIR ATTORNEYS

INVENTORS
KURT LEHOVEC
RAINER ZULEEG

BY *Connolly and Hutz*

THEIR ATTORNEYS 3,134,159

METHOD FOR PRODUCING AN OUT-DIFFUSED GRADED-BASE TRANSISTOR

Kurt Lehovec, Williamstown, and Rainer Zuleeg, North Adams, Mass., assignors to Sprague Electric Company, North Adams, Mass., a corporation of Massachusetts Filed Mar. 26, 1959, Ser. No. 802,242
3 Claims. (Cl. 29—25.3)

This invention relates to a semiconductive material of varying conductivity and more particularly to a method of producing a transistor in which the resistivity in the base varies from the emitter to the collector.

In a transistor, it is advantageous to provide a variation in the resistivity across the body of the conductive material, for example, proceeding normal to a surface of the body from the emitter to the collector. In homogeneous impurity distribution in the body of semiconductive material is a means of obtaining a gradient of resistivity.

Diffusion of impurities into a semiconductor from a gas phase will produce an inhomogeneous impurity distribution. On the other hand, an inhomogeneous impurity distribution may be produced by the out-diffusion or evaporation of impurities in a semiconductive material.

The semiconductive material may be of either of two distinct conductivity types which are referred to herein as p-type conductivity and n-type conductivity. Conductivity refers to the property of low resistance to current flow through the semiconductive material. The types of conductivity in turn are characterized by the types of electronic carriers present in the prospective types. The semiconductive material designated as of p-type conductivity is characterized by holes as electronic carriers whereas the semiconductive material designated as of n-type conductivity is characterized by electrons as the electronic carriers. The carriers in the semiconductive material arise from the presence of certain impurities in trace amounts. Boron, aluminum, indium and gallium promote p-type conduction in a germanium semiconductive body. Phosphorous, arsenic, antimony and bismuth promote n-type conduction in a germanium body.

A junction transistor contains a layer of one type of conductivity sandwiched between two layers of the other type of conductivity. For example, a PNP junction transistor consists of a thin n-type layer sandwiched between two p-type layers. For the purpose of following description this invention is described as relating to a PNP junction transistor structure in which the n-layer will be referred to as the base layer of the transistor. The emitter and the collector of the transistor are connected respectively to the two p-type layers. The emitter layer is typically biased positively with respect to the base n-type layer so that holes are ejected from this p-type layer and injected into the n-type base layer. The collector p-type layer is biased negatively with respect to the base n-type layer to collect the holes injected into the base n-type layer from the emitter.

In the base n-type layer, there may be a concentration of the n-type impurities, which is high in the area near the emitter p-type layer and low near the collector p-type layer. This condition results in an inherent field within the base n-type layer. This field accelerates the flow of injected holes across the base n-type layer. The transit time of the holes through the base n-type layer is reduced with the result that the high frequency response of the transistor is improved. Thus, a gradient of the n-type impurity within the base n-type layer which provides a greater concentration of n-type impurities in the area adjacent the emitter, improves the frequency response of the transistor.

Another improvement of transistor operation by an impurity gradient concerns the operation of the transistor in fast switching. Switching off of the collector current can be achieved when the emitter current is discontinued and no more holes are injected. A finite time delay between the switching off of the emitter current and that of the collector current arises because of the time required for the previously injected holes present in the base n-type to disappear. This period of disappearance of the holes in the base n-type layer after discontinuance of the emitter current is referred to as "hole storage time." The hole storage time is an important factor in fast switching of the transistors and the minimization of hole storage time militates toward improvement of fast switching. An inherent filed within the base n-type layer as a result of a gradient of n-type impurities, as mentioned above, assists in the dissipation of holes by an effect pushing the holes toward the collector and thus decreasing the hole storage time.

Breakdown voltage of a pn-junction is influenced by the resistivity of base n-type layer. A high breakdown voltage is desirable for the PN junction between the collector p-type layer and the base n-type layer. For this purpose, the concentration of n-type impurities in the base layer adjacent to the collector should be low. However, this low impurity concentration should not be maintained through the entire base layer since the total number of n-type impurities in the base layer may then be insufficient to provide the positive space charge required by the applied collector voltage; i.e. the space charge layer of the collector junction would extend through the entire base layer to the emitter; this condition is known as "punch through" and is undesirable for transistor operation. Punch through can be avoided; and yet, a low impurity concentration can be maintained near the collector if the n-type impurity concentration in the base layer increases from collector to emitter to provide a gradient of concentration.

It is thus apparent that a graded distribution of the impurities across the base layer of a transistor serves to improve the operation of the transistor. It is, therefore, important to provide transistors having a graded impurity distribution in the base layer. In some instances, it is desirable to have a very special impurity distribution which cannot be obtained by a simple diffusion of a single impurity. In such an instance, it may be desirable to superimpose the distributions of two types of impurities, e.g., one of the p-type and the other of the n-type. The electrically effective concentration of impurities is then the difference of these concentrations; e.g., by adding to an n-type impurity concentration, N, a p-type impurity concentration, P, an effective N-type concentration N-P results (provided that $P<N$). It is particularly desirable to provide an impurity distribution in the base layer in which the two types of impurities are distributed in a gradient across the base layer in different areas of the base layer. More particularly, in a PNP transistor, a gradient of n-type impurities concentrated at the collector p-type layer side of the base n-type layer can advantageously be combined with a p-type impurity gradient concentrated near the junction of the emitter p-type layer with the base n-type layer.

The usual production of such impurity distributions in semiconductive material involves diffusion of the impurities. If impurities are diffused into a semiconductive material by gaseous diffusion from a gaseous phase adjacent the solid semiconductor, there will be a gradual decrease of the impurity concentration toward the center of the semiconductor body. The diffusion of these impurities into the semiconductor body is achieved by a heat treatment in the appropriate atmosphere which causes the impurities to diffuse and results in a layer of high impurity concentration adjacent to the surface of the semiconductor with a decrease toward the center. There are a number of difficulties and shortcomings involved in this method of producing impurity distributions in semiconductors. On the other hand, evaporation of the impurities from within a semiconductor by diffusion-out of the semiconductor body results in an impurity distribution with a low concentration at the surface.

It is not only necessary to create the appropriate impurity distribution, which can be achieved according to the teachings of this patent, but also to provide emitter and collector junctions at the appropriate location in this impurity distribution. This can be achieved best by using electrochemical methods as follows. In the first method, the germanium is shaped electrochemically to include a narrow web to be used subsequently as the base layer of a transistor; the appropriate impurity distribution across this web is then created according to the teachings of this patent. Alternatively, the impurity distribution is first created in a rather crude slab of germanium which is subsequently provided with appropriate indentations into which emitter and collector contacts will be placed. We shall later refer to rectifying contacts by which are meant such contacts as plated indium contacts to n-type germanium and plated and micro-alloyed contacts whereby a pn-junction is formed by the micro-alloy.

It is an object of this invention to provide a means and method of impurity out-diffusion in a semiconductive material resulting in an improved transistor or diode.

It is still another object of this invention to provide a method of out-diffusion and in-diffusion of impurities which will result in an improved transistor or diode.

These and other objects of this invention will become more apparent upon consideration of the following description taken together with the accompanying drawings in which.

In this invention, the distribution of impurities in a cross-section of a semiconductor body is graded to provide desirable characteristics to the semiconductor body in a transistor structure. The distribution can be set up to provide a low impurity concentration at the surface with a higher impurity concentration distributed at the center. Similarly, the graded impurity distribution may provide two types of impurities with one type present in larger concentration. The semiconductor body is incorporated in an indented transistor which combines the transistor electrodes on the narrow web with the graded impurity distribution. The indentation on the surface of the transistor may be arranged to terminate in the gradient of the impurity distribution to result in unusually advantageous transistor characteristics.

Figure 1:
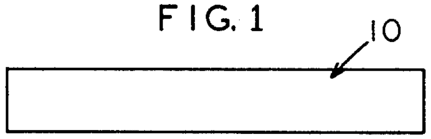
FIG. 1 is a side elevation of an improved block of semi-conductive materials.
Figure 2:
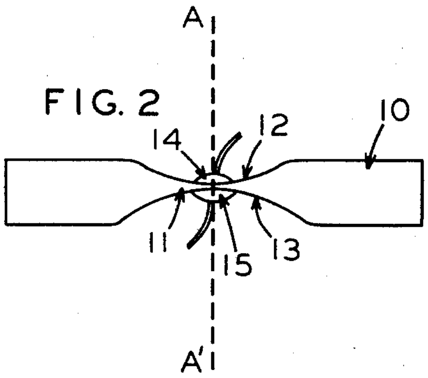
FIG. 2 is a side elevation of an electrochemically etched web semiconductor body.
Figure 3:
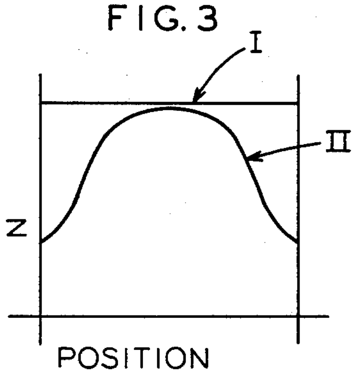
FIG. 3 is an impurity profile of a semiconductor body.

In FIG. 1, a wafer 10 in cross-section is made up of an n-type germanium semiconductor. This can be considered as a single crystal germanium homogeneously doped with antimony to give a resistivity of 0.1 ohm cm. In FIG. 2, a wafer 10 is shown etched for an electrochemical transistor. The chemical etchant forms a web 11 at the center of the wafer 10 by creating two indentations 12 and 13 on the upper and lower surfaces of the wafer 10 respectively. The narrow web 11 may be considered to have a thickness of 0.15 mil in the area between electrodes 14 and 15. The wafer 10 before treatment has a homogeneous impurity distribution. FIG. 3 is a graphical representation of the impurity distribution in the wafer 10 shown in FIG. 1. The ordinate of the chart of FIG. 3 represents the concentration of n-type impurity. The abscissa of the chart represents the vertical cross-section of the wafer 10 as from top to bottom. Straight line I illustrates the homogeneous impurity distribution of the n-type impurity in the wafer 10. Curve II represents a distribution of the n-type impurity having a gradient. The distribution of curve II is the result of heat treatment of the wafer 10 in a high vacuum to cause an out-diffusion of the impurities at the surface, which out-diffusion results in a reduction in the n-type impurity concentration proceeding toward the surfaces from the center of the wafer 10.

Figure 4:
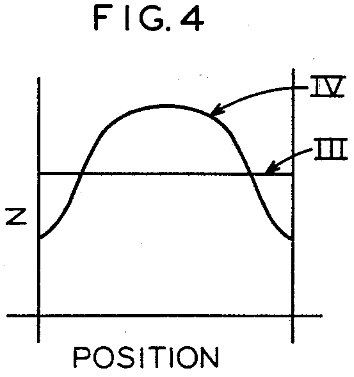
FIG. 4 is another impurity profile of a semiconductor body.

The indented wafer 10 illustrated in FIG. 2 is produced by a suitable method. For example, the wafers are controllably reduced in thickness by means of a chemical etchant to a single thickness of four mils. Then the wafer 10 is subjected to an electrochemical jet etching process which creates the indentations 12 and 13 and forms the web 11 in a selected area at or around the center of wafer 10. The wafer 10 is initially homogeneously doped with antimony to give a resistivity of 0.1 ohm cm. After the etching and formation of the web 11, the wafer 10 is subjected to an out-diffusion process. In this out-diffusion process, the wafer is held in a jig in a tube. The tube is sealed and evacuated to reduce the pressure to less than $10^{-5}$ mm. of mercury. The temperature of the tube is raised to 900° C. and maintained at that temperature for a period of 30 minutes. As a result of this treatment, the antimony in the web 11 is caused to out-diffuse and a distribution of n-type impurity in the web 11 results which is exemplified by curve II in FIG. 3 and curve IV in FIG. 4.

The resultant distribution of impurities in the web 11 of FIG. 2 after out-diffusion provides an impurity concentration in which there is a deficiency of impurity concentrations near the boundary surfaces of the web 11 and a higher impurity concentration in the middle of the web. The advantages of this impurity distribution in comparison with a homogeneous impurity distribution will be appreciated immediately when comparing punch through voltage and collector breakdown. Let us consider two transistors, one with the impurity concentration IV of FIG. 4 in the base layer between emitter and collector junction and the other with the homogeneous impurity concentration III of FIG. 4, both transistors having the same web thickness. Assuming the punch through voltage of both transistors is the same, the homogeneous impurity concentration must be chosen somewhere between the bottom and the top of the distribution IV, let us say at the level of line III in FIG. 4. Clearly, the transistor with the inhomogeneous distribution will have the higher collector breakdown voltage on account of the fact that the impurity concentration at the surface of the web, i.e., adjacent to the collector junction, is less in the case of curve IV than in the case of curve III. In addition to a higher breakdown voltage, we have obtained lower reverse leakage currents at voltages well below the breakdown voltage. As an example, instead of using a homogeneous resistivity of 0.5 ohm cm., we have been able to use resistivity of 0.1 ohm cm., in connection with out-diffusion, and obtained transistors of the same punch through voltage, but improved collector breakdown and collector leakage. The resultant transistor also has improved hole storage as a result of the field which pushes holes from the center of the web of its surfaces, particularly in its effect to the collector region. The transient time across the full cross-section of the web is not improved. The field opposes flow of the holes from the emitter to the middle of the web and assists the flow of the holes from the middle of the web to the collector. However, the resultant transistor is still superior in hole storage time, collector breakdown and collector leakage.

Figure 5:
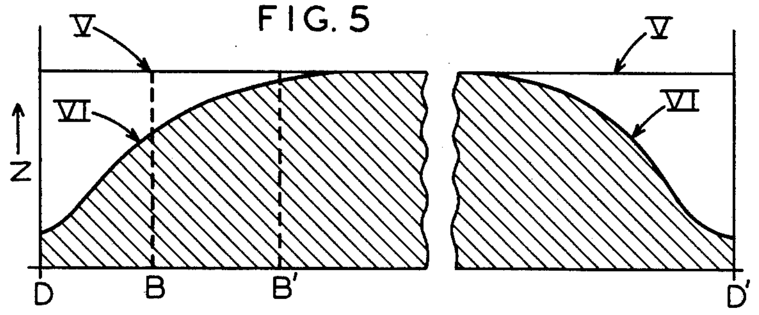
FIG. 5 is a profile representing an impurity gradient in a semiconductor body according to this invention.

A transistor may also be made up from a semiconductor body which is subjected to out-diffusion in advance of the electrochemically etched web. Referring to FIG. 5, a chart shows two impurity distributions in a wafer of germanium such as the wafer of FIG. 1. The straight line curve V illustrates the impurity distribution of homogeneously distributed doping agent antimony in the wafer 10. The curve VI illustrates the impurity concentration of the antimony in the germanium after out-diffusion. In this chart, the ordinate represents the n-type impurity distribution and the abscissa represents the cross-sectional distance from a surface of the wafer 10. It is not shown in curve VI, but readily understood, that equilateral distribution of the impurity from each surface is produced by the out-diffusion.

Figure 6:
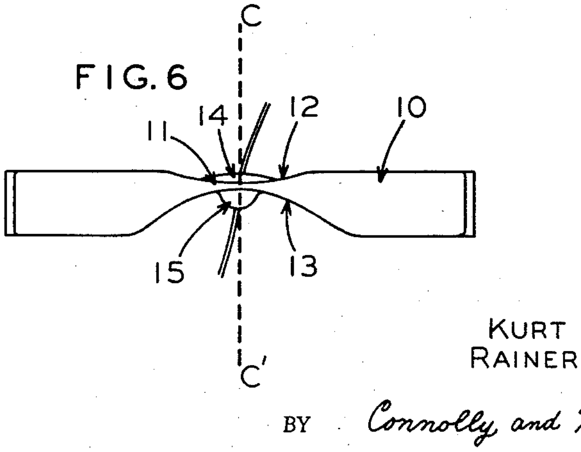
FIG. 6 is a cross-section of an etched web transistor structure with collectors and emitters connected to the web.

Subsequent to the out-diffusion of the n-type impurities in this embodiment of the invention, the surfaces of the wafer 10 are etched as shown in FIG. 6 to produce indentations 12 and 13 comparable to the indentations 12 and 13 of the wafer 10 shown in FIG. 2. The depth of such indentations is represented on the chart of FIG. 5 by two dotted lines B and B′ in FIGURE 5 raised perpendicular from the abscissa parallel to the ordinate. Accordingly, the dotted lines B and B′ represent planes of depth of the penetration of the indentations parallel to the flat surfaces of the wafer 10 but displaced from these flat surfaces in direction of the line CC′ of FIGURE 6. The dotted line B and B′ represent planes within the wafer 10 extending parallel to the flat surfaces of the wafer. Assuming the ordinates of the chart to represent the surfaces of the wafer 10 the line B and B′ represent planes spaced away from the surfaces and within the wafer 10 and indicate distances to which the indentations are etched in the wafer 10.

The indentation terminating at the position represented by the line B has been etched from left to right in FIGURE 5, i.e., from D to B, while the indentation terminating at the position represented by the line B′ has been etched in direction from right to left in FIGURE 5, i.e., from D′ to B′. The penetration at B is rather shallow and it terminates at a relatively low n-type impurity concentration in the semiconductor body. In contrast to the indentation represented by B, the indentation represented by B′ is deeper and terminates at a higher concentration of n-type impurities. In the electrochemical transistor made up from this body, it is advantageous to etch the collector indentation to the depth of B and attach the collector electrode at this low n-type impurity concentration while the emitter indentation is etched to a depth B′ and the emitter electrode is attached to this depth plane and concentration.

In FIG. 6 an electrochemical transistor structure is shown in which an etching wafer 10 having an upper indentation 12 and an under indentation 13 is formed with a web 11. The collector electrode 14 is formed in the indentation 12 by any suitable collector formation jet plating procedure, e.g., a collector material such as indium-gallium is jet plated into the indentation and subjected to a microalloying process which restricts the alloy formation to a thin region. One such process is described in IRE Transactions on Electron Devices, April 1958, Vol. ED–5, No. 2, page 49. An emitter electrode 15 is attached in the under indentation 13 by a plating of an emitter alloy which is restricted to 0.15 mil from the surface on which it is plated. This assembly of electrodes on the web 11 in the semiconductor wafer 10 which was first out-diffused and then etched as described in connection with FIG. 5 results in a positioning of the collector electrode 14 at an impurity distribution indicated at the inner section of the dotted line B on the curve VI while the emitter electrode 15 is attached at a point where the line B′ crosses the curve VI. It will be seen that the transistor of FIG. 6 has an impurity concentration decreasing steadily from emitter to collector. Thus, the drift field set up by this impurity gradient assists the flow of injected holes from emitter to collector resulting in a higher frequency range of useful operation.

Figure 7:
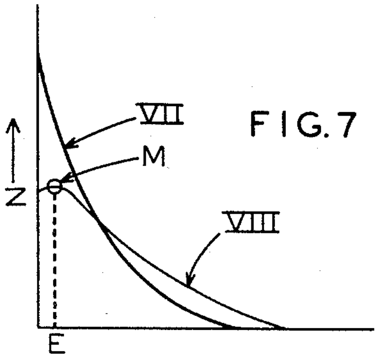
FIG. 7 is an impurity profile of a portion of a semiconductor body according to this invention.

The impurity gradients obtained in the above-described embodiments result from out-diffusion of n-type impurities in a germanium body. The in-diffusion of an n-type impurity into the germanium body will result in another distribution of the impurities. In first in-diffusion and then out-diffusion of impurities, a distribution of impurities in the germanium body is produced, and a maximum in the concentration of impurities at a certain distance from the surface of the wafer. An example of this combined in-diffusion and out-diffusion is represented by the chart of FIG. 7. In FIG. 7, the abscissa represents the cross-section across a germanium wafer, which has been subjected to a combination of out-diffusion and in-diffusion. Points along the abscissa represent cross-sectional distances into the body normal to the surface of the germanium body. The ordinate represents impurity concentration in the wafer and the chart is plotted to show the impurity concentrations at locations within the germanium wafer.

In the example of this invention illustrated by FIG. 7, the germanium wafer was subjected to in-diffusion of antimony by exposing the germanium wafer at 800° C. for two hours to an inert gass carrier stream, e.g., hydrogen, which was first passed over antimony at a temperature of 550° C. The impurity concentration resulting from this in-diffusion is represented by curve VII. This shows an impurity distribution with a maximum at the surface of the germanium wafer and tapering to lower values progressively from the surface. After the in-diffusion, the germanium wafer was heated at an elevated temperature under an inert gas or in a vacuum to bring about out-diffusion of antimony. The curve VIII represents the distribution of the antimony impurity in the germanium after out-diffusion for one-half hour under vacuum at a temperature of 750° C. The curve VIII shows a significant decrease of the n-type impurity adjacent the surface of the germanium with a maximum of concentration at a point adjacent to, but slightly removed from, the surface. At some points within the germanium wafer, a slight increase in the distribution of the n-type impurity is shown by the curve VIII. Thus, it is seen that, after one-half hour at this temperature, the antimony becomes more evenly distributed in the germanium body. At the position E of this maximum, the impurity concentration varies little with position; therefore, an emitter junction placed into the wafer at the position E is relatively insensitive to small inaccuracies in the depth of positioning as far as impurity concentration in the germanium wafer adjacent to the junction is concerned. This advantage is not present in case of curve VII.

Figure 8:
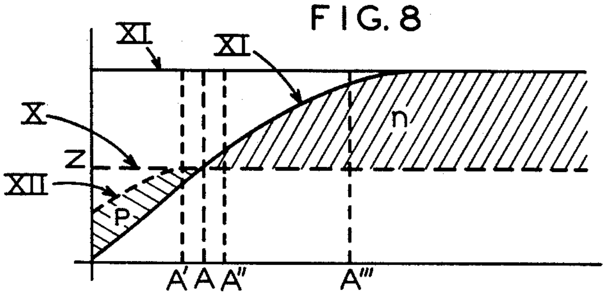
FIG. 8 is another impurity profile of a portion of a semiconductor body according to this invention.
Figure 9:
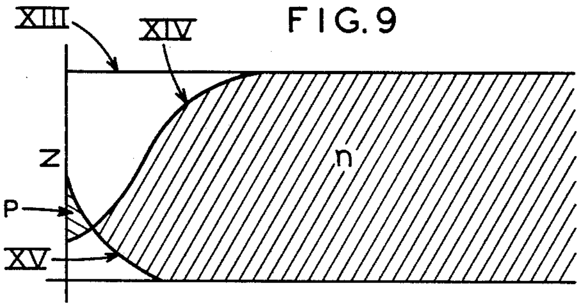
FIG. 9 is another impurity profile of a portion of a finished semiconductor body according to this invention.

Additional impurity distribution gradients possible according to this invention are illustrated by the charts of FIGS. 8 and 9. FIG. 8 is a chart representing a semiconductor body containing both a p-type and an n-type impurity. In the body represented in FIG. 8, there is an area of p-type conductivity and an area of n-type conductivity. The area of p-type conductivity is more adjacent to the surface of the semiconductor body represented by the left side of the chart. The n-type conductivity area is located to the right of the p-type conductivity area on the chart. Between these two areas of opposite conductivity is located a graded p-n junction. This distribution and the p-n junction result from the out-diffusion of the p-type and n-type impurities in the body. The rate of out-diffusion of the n-type impurities is faster and because of the more rapid out-diffusion of the n-type impurities, the area of the semiconductor body adjacent the surface has a p-type conductivity. This prevalence of p-type impurities over n-type impurities near the surface is the result of the predominate out-diffusion of the n-type impurities over the out-diffusion of the p-type impurities. In the semiconductor body represented in FIG. 8, the area adjacent the surface is characterized by p-type conductivity up to the depth indicated by the line A′. The limit of the predominance of the p-type conductivity is at A. Between the lines A′ and A″, there is formed a graded p-n junction. To the right of the line A, the semiconductor body is of n-type conductivity. In this region, the predominately faster out-diffusion of the n-type impurity has not carried the concentration of the n-type impurity below the point at which p-type impurity predominates.

The transistor can be made up from a semiconductor body having the characteristics represented by FIG. 8. This transistor may be formed by a jet etch indentation from the indicated surface into the semiconductor body to a depth indicated at line A′. The collector contact is applied to the etch surface at this point. The junction A in this semiconductor body then becomes a collector and a rectifying contact with the side in which the n-type predominates. A jet etch from right to left into the semiconductor body is terminated at the line A‴.

An indium-cadmium alloy may be plated on the etched surface in this area to create an emitter. A semiconductive device is formed with the collector contact at the junction A and the emitter contact at the junction A″.

The impurity distribution indicated by the curve XII may be made use of in transistor construction. An example is seen in the use of a p-n junction around the position A as the collector junction of a transistor. We require an ohmic contact to the p-side of this junction. Such ohmic contact is conveniently created by jet etching an indentation into the body a depth to the plane of A′ as indicated in FIG. 8, proceeding from left to right. At this depth of indentation, an area is plated with an indium-cadmium alloy at the bottom of the indentation. This is followed by heat cycling to microalloy the indium-cadmium alloy with the p-type germanium. The collector junction is the graded junction inherent in the curve XII of FIG. 8 and lying to the right of plane A′. This has the property of a high breakdown voltage as a consequence of this grading. The emitter junction is made at some area, for example, in the plane of A‴, to the right as seen in FIG. 8. This is in the n-type part of the impurity distribution curve XII, but preferably still within the inhomogeneous impurity distribution. The emitter junction is made by jet etching an indentation from right to left as seen in FIG. 8 and terminating at the depth A‴. An indium-cadmium plating at the bottom of the indentation at this area and a microalloying of the indium-cadmium plating gives the emitter junction on the distribution curve XII.

The distribution curve XII of FIG. 8 can also be utilized with a modified arrangement of the emitter and collector junction. In this modification, both the emitter and collector junction are placed in the n-type impurity gradient of the distribution curve XII. The junctions for this semiconductive device involve, first, jet etch, followed by the indium-cadmium plating and microalloying as described above. In this case, however, the jet etching from left to right as indicated in FIG. 8 is carried to the depth of the plane A″. Such jet etching removes all the p-type layer and reaches into the distribution of n-type predominance. The collector junction is then provided at the n-type layer at the bottom of this jet etch indentation in an area at the plane A″. The emitter junction can be placed at an area such as A″ by jet etching, indium-cadmium plating, and microalloying. It is a feature that the part of the impurity distribution curve XII which is utilized in this transistor resembles the distribution curve VI of FIG. 5. An added advantage, however, present in the distribution curve XII of FIG. 8 is the positioning of the collector junction close to the p-n junction at the plane A. The impurity concentration adjacent to the collector can, thus, be made relatively small as distinguished from the case of the impurity distribution curve VI in FIG. 5, wherein the impurity concentration at the collector is limited to values higher than the surface concentration of the wafer which remains finite in out-diffusion.

In FIG. 9, there is illustrated the impurity concentrations of n-type and p-type resulting when the effects of out-diffusion of n-type impurities and the in-diffusion of p-type impurities is combined. Starting with a germanium wafer having a homogeneous distribution of n-type impurities as discussed in connection with the wafer 10 of FIG. 1 and in-diffusing into that n-type semiconductor p-type impurities, while at the same time, out-diffusing n-type impurities, a p-n junction may be created. The distribution of n-type impurities is similar to curve VI of FIG. 5, while that of p-type impurities is similar to curve VII of FIG. 7. The resulting graded p-n junction is similar to that illustrated by FIG. 8 in that the p-type impurities predominates in the area adjacent to the surface of the semiconductor body and the n-type impurity predominates in the body on the interior side of the graded p-n junction. This impurity distribution may be employed in a manner similar to that described above in connection with FIG. 8.

It is advantageous to achieve the impurity distributions as described in connecton with this invention because of the improved control over the impurity distribution in the resultant semiconductive device. In producing transistors, for example, particularly in large numbers and rapidly, this invention provides the means for accurately and easily creating junctions at desired impurity distributions. Other advantages of this invention include its adaptation to existing procedures while improving thereon.

In the above description, several specific embodiments of this invention have been set forth for the purpose of illustration. It will be understood that this illustration is presented to assist comprehension of the invention and that further modifications may be made within the spirit of this invention, which is limited solely by the scope of the following claims.

What is claimed is:

1. The method of forming a semiconducting device having an inhomogeneous distribution of impurities, consisting of incorporating impurities within a semiconductor body, out-diffusing a portion of said impurities from said semiconductor body to thereby create an inhomogeneous distribution of said impurities in said body by said out-diffusion, removing a portion of said body having said inhomogeneous distribution of impurities to produce a narrow web in said body within said inhomogeneous distribution of impurities to provide a greater impurity distribution on one side and a lesser impurity distribution on the other side and a region of maximum impurity concentration spaced away from the side of the lesser impurity, attaching one electrode to one side of said narrow web and connecting another electrode to the other side of said narrow web.

2. A method of producing a junction transistor with a graded impurity distribution in the base layer, consisting of subjecting a wafer having homogeneous impurity distribution to out-diffusion, removing material from out-diffused portion of the wafer to produce a narrow web region in the wafer, forming one surface of the web at a region with inhomogeneous impurity distribution due to out-diffusion, forming the other surface of the web in the region with inhomogeneous impurity distribution of a smaller concentration of impurity than said first surface and spaced away from the region of maximum impurity concentration, and providing emitter and collector junctions at the opposite sides of the web, the collector being located at the side of the web with the smaller impurity concentration.

3. A method of providing an inhomogeneous impurity distribution in a semiconducting wafer consisting of in-diffusion of impurities from the surface into the wafer, and subsequently, out-diffusing a part of the indiffused impurities to provide an impurity distribution having maximum of impurity concentration at a plane within the surface fo the semiconducting wafer, removing a portion of said wafer having said inhomogeneous distribution of impurities to produce a narrow web in said body within said inhomogeneous distribution of impurities to provide a greater impurity distribution on one side and a lesser impurity distribution on the other side, and a region of maximum impurity concentration spaced away from the side of the lesser impurity, attaching an emitter electrode to one side of said narrow web and connecting a collector electrode to the other side of said narrow web.

References Cited in the file of this patent

UNITED STATES PATENTS

| | | |
|---|---|---|
| 2,784,121 | Fuller | Mar. 5, 1957 |
| 2,810,870 | Hunter et al. | Oct. 22, 1957 |
| 2,815,303 | Smith | Dec. 3, 1957 |
| 2,819,990 | Fuller et al. | Jan. 14, 1958 |
| 2,842,723 | Koch et al. | July 8, 1958 |
| 2,849,664 | Beale | Aug. 26, 1958 |
| 2,894,862 | Mueller | July 14, 1959 |
| 2,898,247 | Hunter | Aug. 4, 1959 |
| 2,900,286 | Goldstein | Aug. 18, 1959 |
| 2,947,923 | Pardue | Aug. 2, 1960 |